United States Patent
Roohparvar

(10) Patent No.: US 8,134,872 B2
(45) Date of Patent: *Mar. 13, 2012

(54) APPARATUS AND METHODS FOR PROGRAMMING MULTILEVEL-CELL NAND MEMORY DEVICES

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 308 days.

This patent is subject to a terminal disclaimer.

(21) Appl. No.: 12/552,601

(22) Filed: Sep. 2, 2009

(65) Prior Publication Data

US 2009/0327594 A1 Dec. 31, 2009

Related U.S. Application Data

(63) Continuation of application No. 11/450,759, filed on Jun. 9, 2006, now Pat. No. 7,586,784.

(51) Int. Cl.
*G11C 11/34* (2006.01)

(52) U.S. Cl. ............. 365/185.12; 365/185.17; 365/200; 365/201

(58) Field of Classification Search ............. 365/185.12, 365/185.17, 200, 201
See application file for complete search history.

(56) References Cited

U.S. PATENT DOCUMENTS

| | | | |
|---|---|---|---|
| 6,282,121 B1 | 8/2001 | Cho et al. | |
| 6,836,432 B1 | 12/2004 | Parker et al. | |
| 6,988,175 B2 | 1/2006 | Lasser | |
| 7,193,896 B2 | 3/2007 | Shiga | |
| 7,345,928 B2 | 3/2008 | Li | |
| 7,586,784 B2 * | 9/2009 | Roohparvar | 365/185.12 |
| 2008/0049496 A1 | 2/2008 | Abraham | |

* cited by examiner

*Primary Examiner* — Alexander Sofocleous
(74) *Attorney, Agent, or Firm* — Leffert Jay & Polglaze, P.A.

(57) ABSTRACT

Methods and apparatus are provided. A first data value is read from a first memory cell and is stored. An attempt is made to add a second data value to the first memory cell. If the attempt to add the second data value to the first memory cell is unsuccessful, the first data value and the second data value are written to one or more other memory cells.

20 Claims, 4 Drawing Sheets

US 8,134,872 B2

APPARATUS AND METHODS FOR PROGRAMMING MULTILEVEL-CELL NAND MEMORY DEVICES

RELATED APPLICATION

This application is a continuation of U.S. patent application Ser. No. 11/450,759, entitled "APPARATUS AND METHODS FOR PROGRAMMING MULTILEVEL-CELL NAND MEMORY DEVICES," filed on Jun. 9, 2006 and issued as U.S. Pat. No. 7,586,784 on Sep. 8, 2009, which application is commonly assigned and incorporated in its entirety herein by reference.

FIELD

The present invention relates generally to memory devices and in particular the present invention relates to apparatus and methods for programming multilevel-cell NAND memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data, such as a basic input/output system (BIOS), are typically stored in flash memory devices for use in personal computer systems.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a cost effective non-volatile memory.

Multilevel cells take advantage of the analog nature of a traditional flash cell by assigning a bit pattern to a specific threshold voltage ($V_t$) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space or margin of 0.2V to 0.4V is between each range to keep the $V_t$ distributions from overlapping. If the voltage stored on the cell is within the first range, the cell is storing a logical 11 state and is typically considered the erased state of the cell. If the voltage is within the second range, the cell is storing a logical 01 state. This continues for as many ranges that are used for the cell provided these voltage ranges remain stable during the lifetime operation of the memory cell.

For MLC NAND flash memory devices, two or more pages of data may be written into memory cells corresponding to a single physical page. Moreover, for some MLC NAND flash memory devices, the order in which data is written to rows of a memory array may be scrambled, since such scrambling can act to mitigate disturb issues. For example, logical page 0 may get written to a physical lower page, and logical page 4 may get written to the corresponding physical upper page. Therefore, one problem involving MLC NAND flash memory devices is that if a program operation is unsuccessful, not only the present upper page gets corrupted, but the lower companion page may also get corrupted. Moreover, the scrambling mechanism typically varies from designer to designer and is generally not accessible to the end user. Therefore, only the designer may know what page corresponds to the companion page.

For the reasons stated above, and for other reasons stated below which will become apparent to those skilled in the art upon reading and understanding the present specification, there is a need in the art for alternatives to existing programming schemes for MLC NAND flash memory devices.

DETAILED DESCRIPTION

Figure 1:
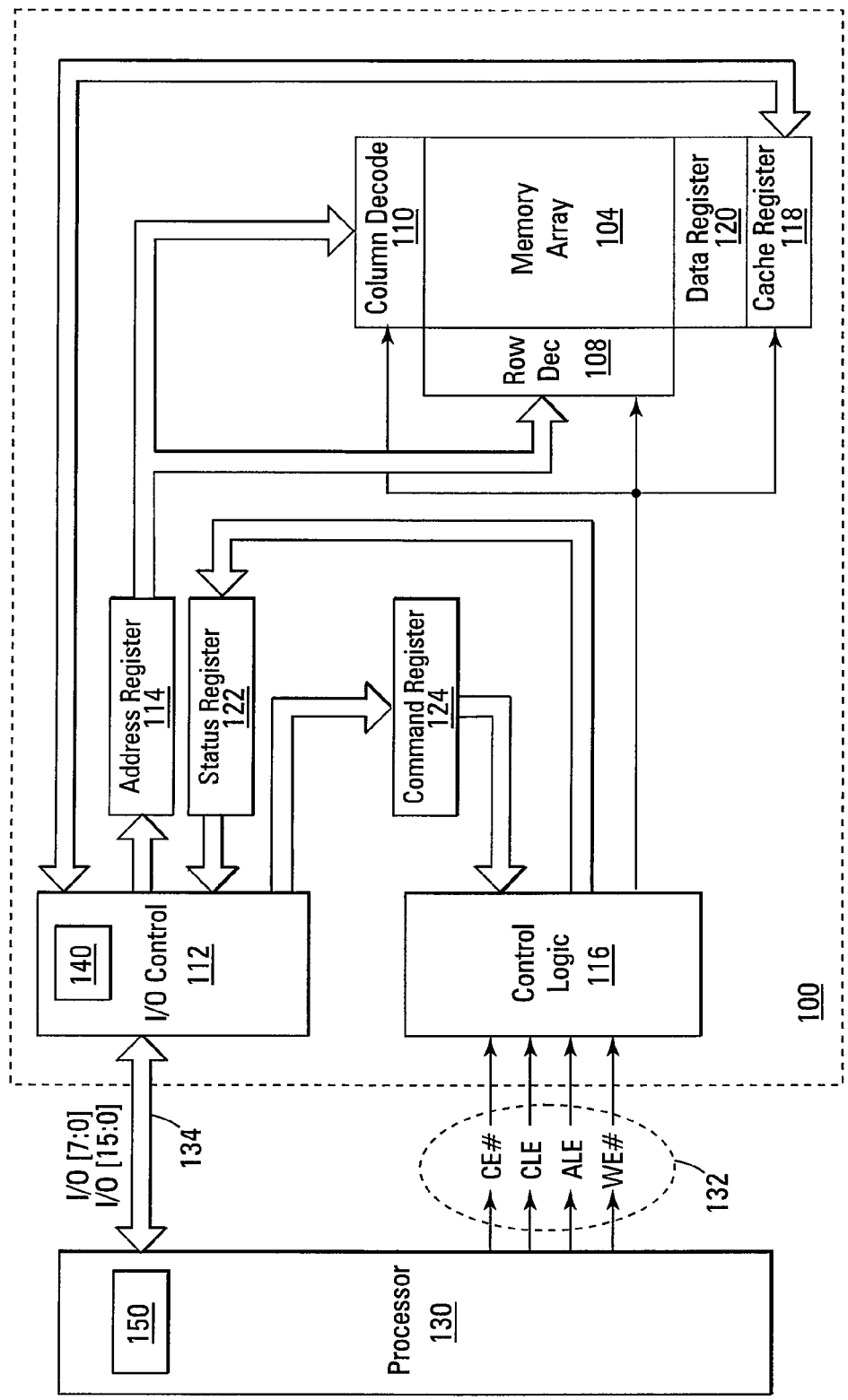
FIG. 1 is a simplified block diagram of a memory device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a simplified block diagram of a NAND flash memory device 100 coupled to a processor 130 as part of an electronic system, according to an embodiment of the invention. The processor 130 may be a memory controller or other external host device. Memory device 100 includes an array of memory cells 104 arranged in rows and columns. A row decoder 108 and a column decoder 110 are provided to decode address signals. Address signals are received and decoded to access memory array 104. Memory device 100 also includes input/output (I/O) to manage input of commands, addresses and data to the memory device 100 as well as output of data and status information from the memory device 100. An address register 114 is coupled between I/O control circuitry 112 and row decoder 108 and column decoder 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decoder 108 and column decoder 110 to control the row decoder 108 and column decoder 110 in response to the addresses. Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE#. Memory device 100 receives command signals (or commands), address signals (or addresses), and data signals (or data) from processor 130 at an input/output (I/O) port over a multiplexed I/O bus 134 and outputs data to processor 130 through the I/O port over I/O bus 134.

Specifically, the commands are received over input/output (I/O) pins [0:7] of I/O bus 134 at I/O control circuitry 112 and are written into command register 124. The addresses are received over input/output (I/O) pins [0:7] of bus 134 at I/O control circuitry 112 and are written into address register 114. The data are received over input/output (I/O) pins [0:7] for an 8-bit device or input/output (I/O) pins [0:15] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [0:7] for an 8-bit device or input/output (I/O) pins [0:15] for a 16-bit device. It will be appreciated by those skilled in the art that additional circuitry and control signals can be provided, and that the memory device of FIG. 1 has been simplified to help focus on the invention. Additionally, while specific I/O pins are described in accordance with popular conventions for receipt and output of the various signals, it is noted that other combinations or numbers of I/O pins may be used in the various embodiments.

For one embodiment, memory device 100 may include one or more storage registers 140, e.g., as a part of I/O control circuitry 112. Alternatively, for another embodiment, processor 130 may include one or more storage registers 150. In another embodiment, processor 130 includes storage register 150 and memory device 100 includes one or more storage registers 140. For one embodiment, the one or more storage registers 140 and storage register 150 may be volatile registers, such as a static random access memory (SRAM), or non-volatile registers. For another embodiment, the one or more storage registers 140 are inaccessible from the I/O port of memory device 100 and thus from I/O bus 134.

Figure 2:
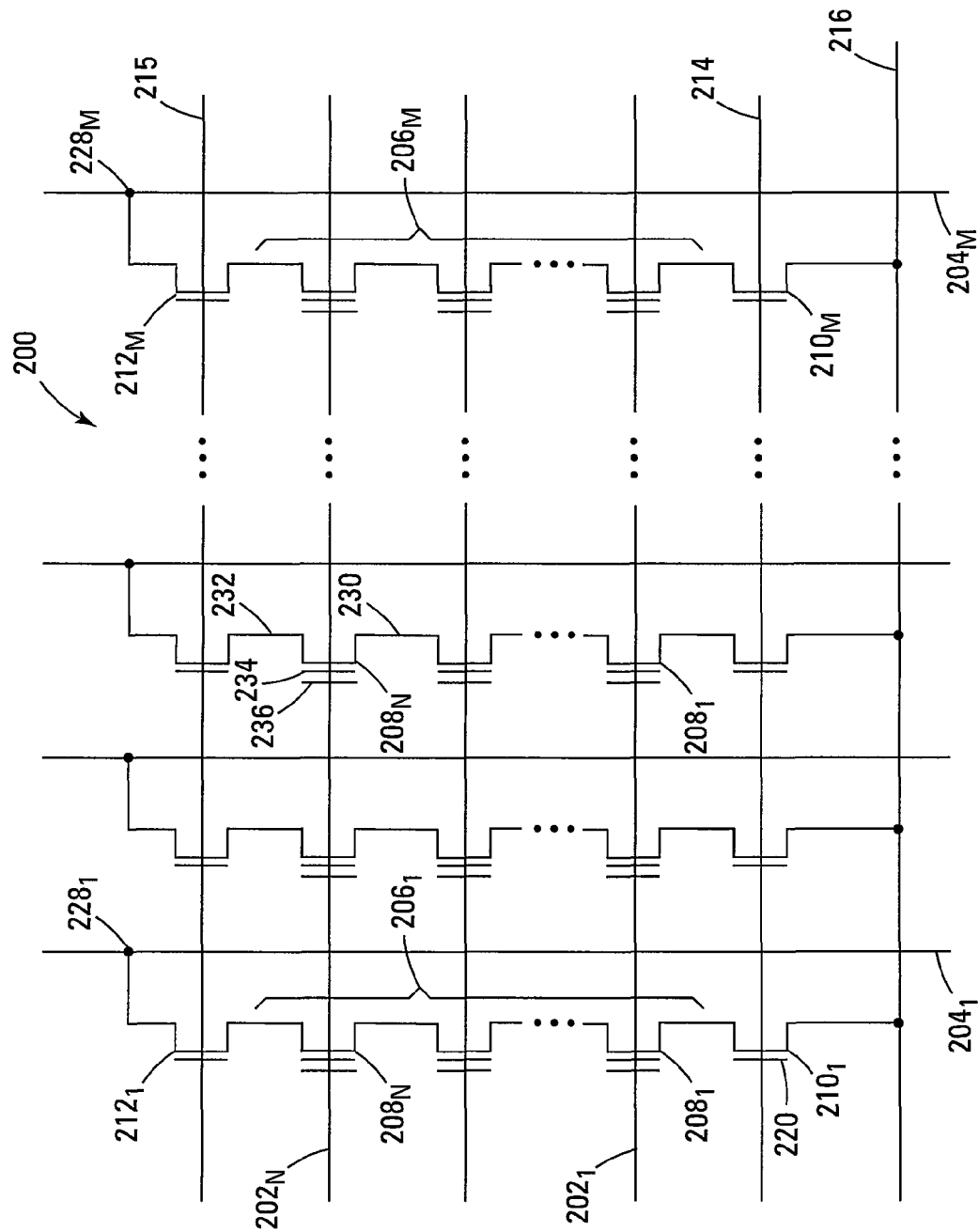
FIG. 2 is a schematic of a NAND memory array in accordance with another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

For one embodiment, each of the word lines 202 typically corresponds to two physical pages of memory array 200. For example, intersections between odd columns and a word line 202 correspond to one physical page and intersections between even columns and a word line 202 correspond to the other physical page.

For some embodiments, each of the memory cells 208 of memory array 200 is a multilevel cell for storing multiple bits when its floating gate is charged to different levels. For example, each memory cell may be assigned four different voltage ranges of 200 mV for each range. For another embodiment, a dead space or guard band of 0.2V to 0.4V is between each range. If the charge stored on the cell causes a threshold voltage Vt within the first range, the cell is storing a logic 11 (erased state), a Vt within the second range, a logic 01, a Vt within the third range, a logic 00, and a Vt within the fourth range, a logic 10. Since each multilevel cell takes on different logic values for different Vt ranges, it follows that each physical page of memory array 200 can store multiple pages of data received from processor 130 of FIG. 1, for example, by shifting the Vt ranges of the memory cells of the physical page.

Figure 3:
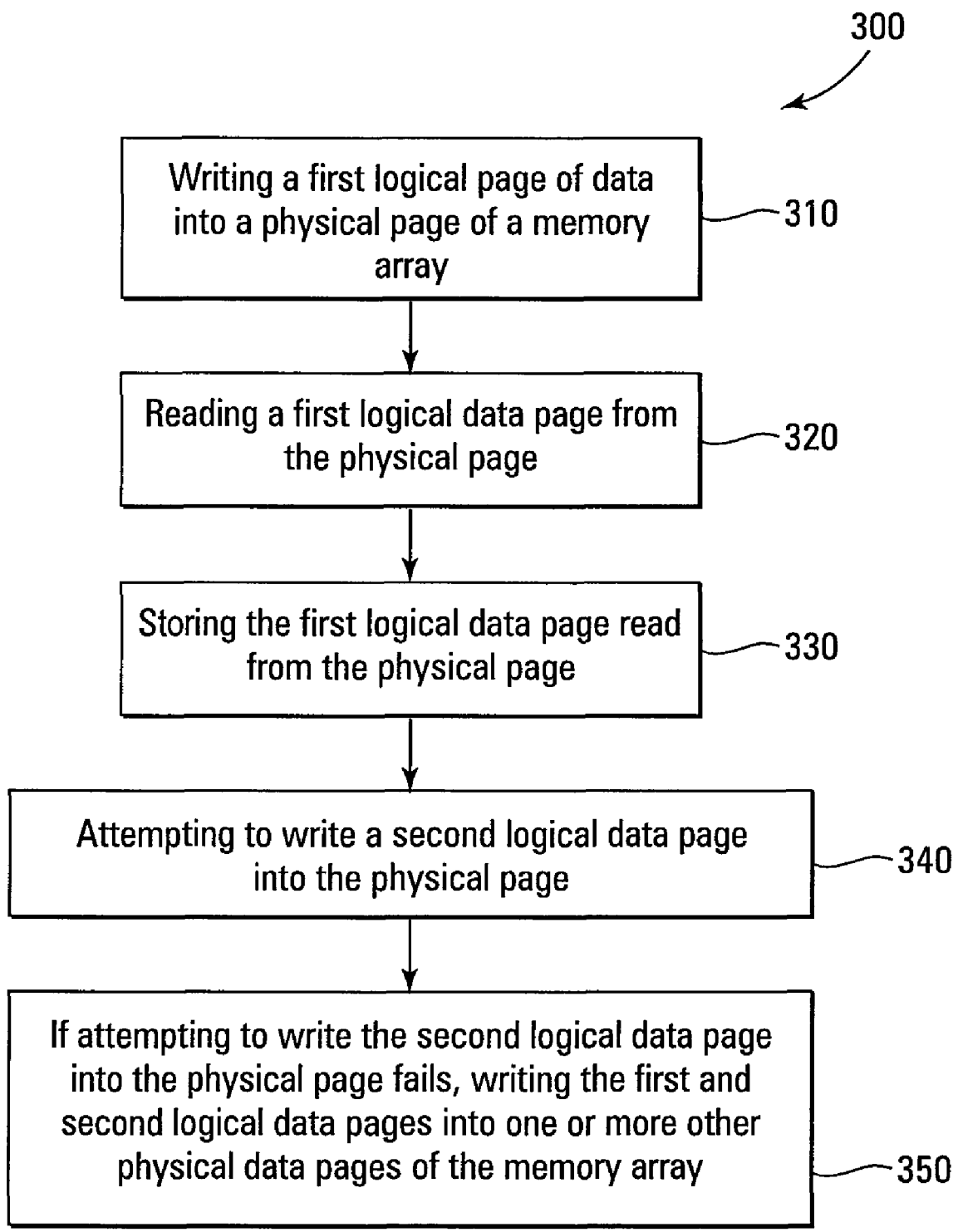
FIG. 3 is a flowchart of a method, according to another embodiment of the invention.

FIG. 3 is a flowchart of a method 300 of operating a memory device, such as memory device 100 of FIG. 1, according to another embodiment of the invention. At block 310 a first logical page of data is written into a physical page of a memory array, such as memory array 200 of FIG. 2. The first logical data page is then read from the physical page at block 320 and is stored in a second physical location at block 330. For one embodiment, the first logical page of data may be stored in storage register 140 of memory device 100 or in storage register 150 of processor 130. For another embodiment, a logical address of the first logical data page may also be stored, e.g., in either storage register 140 or storage register 150.

At block 340, one or more attempts are made to write a second logical data page into the physical page. For another embodiment, the first logical page of data is read and stored in the storage register in response to attempting to write the second logical page of data into the physical page. For example, the memory device may read and store the first logical page of data in response to the processor requesting to write the second logical page of data into the physical page. For another embodiment, the processor may request the first logical page of data before attempts are made to write the second logical page of data into the physical page. Where the processor requests the first logical page of data from the memory device, it may be a request for a companion page of the second logical page of data. In such an embodiment, it may be necessary for the processor to know what logical page of data corresponded to the companion page of the second logical page of data. A device driver or other algorithm could be provided on the processor to track the same programming sequence that is to be used internally to the memory device. In this manner, the processor could know in advance to what physical page the second logical page of data is to be programmed, and what other logical address or addresses may correspond to that physical page. The processor could then request companion page data by logical address. Alternatively, in response to an external request for companion page data, the memory device could provide the data and logical address corresponding to the companion page of the next physical page to be programmed.

At block 350, if an attempt to write the second logical data page into the physical page fails, the first and second logical data pages are written into one or more other physical data pages of the memory array. For some embodiments, where the processor stores the first logical data page for possible re-writing to the memory device, the memory device provides the logical address of the first logical data page to the processor in addition to the data values so that the processor knows how to address the first logical data page when the first logical data page is written into one or more other physical data pages of the memory array. Upon re-writing the first logical data page to another physical data page of the memory array, the memory device would need to re-map the logical address of the first logical data page to correspond to the other physical data page such that future requests to read the first logical data page would return data from the other physical data page rather than the initial physical data page.

More specifically, for one embodiment, programming of memory array 200 commences by removing charge from the floating gate of each memory cell 208 to produce the threshold voltage within the first range corresponding to an erased state. Subsequently, the memory cells 208 of each physical page of memory array 200 are programmed with data corresponding to a first logical page of data for that physical page. Specifically, the data corresponding to the first logical page of data for a physical page are sent from a processor, such as processor 130, to a data register, such as data register 120 of FIG. 1, and the first page of data is written to the memory cells corresponding to the physical page by programming the memory cells to the correct threshold voltages. The first page of data is then read and stored in a storage register, such as storage register 140 of memory device 100 (FIG. 1) or storage register 150 of processor 130 (FIG. 1).

After storing the first page of data, a second page of data is sent from the processor to the data register to be added to the memory cells corresponding to the physical page on which the first page of data was written, and an attempt is made to program the second page of data into the physical page. If programming of the second data page is successful, the physical page will contain threshold voltages indicative of two bits of data per memory cell.

If programming of the second data page is unsuccessful, there is a possibility that the first data page of the physical page has been corrupted by the programming attempts of the second data page. Thus, the data from the storage register corresponding to the first data page and data corresponding to the second data page may be re-programmed to one or more physical pages of the memory array. For one embodiment, this involves transferring the data corresponding to the second data page from the data register to the different physical page followed by sending the data corresponding to the first data page from the storage register to the data register and then from the data register either to the same physical page as the second data page or to another physical page. Alternatively, for another embodiment, the data corresponding to the first data page are sent from the storage register to the data register and then from the data register to the different physical page followed by resending the data corresponding to the second data page from the processor to the data register and then from the data register to the different physical page. Note that the aforementioned programming method is not limited to programming two data pages to each physical page, but may be used for programming more than two pages to a physical page. This would involve increasing the number of storage registers 140 or 150 for storing previously programmed data pages. In general, for the various embodiments, each logical page corresponding to a physical page whose programming operation has failed after successfully programming a first or lower logical page would be re-written to some other location of the memory array.

Figure 4:
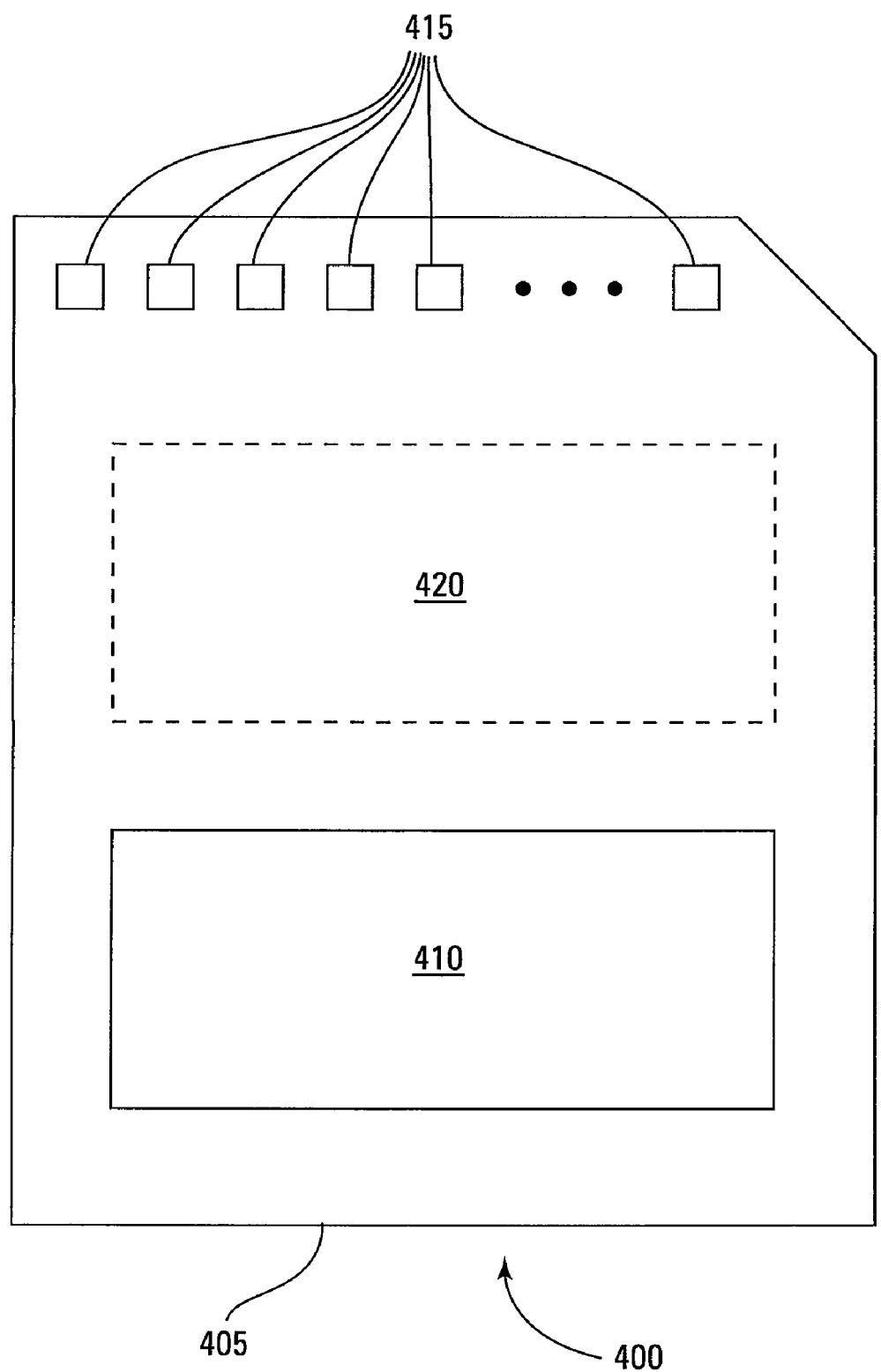
FIG. 4 is an illustration of an exemplary memory module, according to another embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 may be a NAND flash memory device, such as NAND memory device 100 of FIG. 1, in accordance with the invention, having a memory array, such as memory array 200 of FIG. 2. Where present, the housing 405 includes one or more contacts 415 for communication with a host device, such as processor 130 of FIG. 1. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like.

In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

CONCLUSION

Various embodiments of the invention provide apparatus and methods for programming multilevel-cell NAND memory devices. For one embodiment, a first data value is read from a first memory cell and is stored. An attempt is made to add a second data value to the first memory cell. If the attempt to add the second data value to the first memory cell is unsuccessful, the first data value and the second data value are written to a second memory cell. For another embodiment, the first data value is stored in a storage register of a memory device or a processor coupled to the memory device. The storage register may be a volatile or non-volatile register for another embodiment.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory device, comprising:
writing first data to a first location of a memory array;
reading the first data from the first location of the memory array;
storing the first data read from the first location of the memory array;
attempting to write second data to the first location of the memory array;
writing the first and second data to one or more other locations of the memory array if attempting to write the second data to the first location of the memory array is unsuccessful; and
storing a logical address of the first data.

2. The method of claim 1, wherein storing the first data comprises storing the first data in a volatile register.

3. The method of claim 1, wherein storing the first data comprises storing the first data on the memory device.

4. The method of claim 1, wherein the first and second locations comprise one or more multilevel memory cells.

5. The method of claim 1, wherein writing the first and second data to the one or more other locations of the memory array comprises writing the second data to another location of the memory array before writing the first data value to another location of the memory array.

6. The method of claim 1, wherein storing the logical address of the first data comprises storing the logical address of the first data on the memory device.

7. A method of operating a processor of an electronic system, comprising:
writing first data to a first location of a memory device of the electronic system;
requesting the first data from the memory device;
storing the first data requested from the memory device;
attempting to write second data to the first location of the memory device; and
writing the stored first data and the second data to one or more other locations of the memory device if attempting to write second data to the first location of the memory device fails;
wherein requesting the first data from the memory device occurs in response to attempting to write the second data to the first location of the memory device.

8. The method of claim 7 further comprises:
requesting a logical address of the first data from the memory device; and
storing the logical address of the first data.

9. The method of claim 7 wherein writing the stored first data and the second data to the one or more other locations of the memory device comprises sending the stored first data to the one or more other locations of the memory device and subsequently sending the second data to the one or more other locations of the memory device.

10. A method of operating a processor of an electronic system, comprising:
writing first data to a first location of a memory device of the electronic system;
requesting the first data from the memory device;
storing the first data requested from the memory device;
attempting to write second data to the first location of the memory device;

writing the stored first data and the second data to one or more other locations of the memory device if attempting to write second data to the first location of the memory device fails;
requesting a logical address of the first data from the memory device; and
storing the logical address of the first data.

11. The method of claim 10, wherein requesting the first data from the memory device occurs before attempting to write the second data to the first location of the memory device.

12. A method of operating a memory device adapted to store multiple logical data pages per physical data page, the method comprising:
reading a first logical data page of a first physical data page;
storing the first logical data page in an additional location;
storing a logical address of the first logical data page;
attempting to write a second logical data page to the first physical data page; and
if the attempt to write the second logical data page to the first physical data page fails, attempting to write the first logical data page and the second logical data page to one or more other physical data pages of the memory device.

13. The method of claim 12, wherein reading the first logical data page occurs in response to receiving an external request to write the second logical data page.

14. The method of claim 13, wherein reading the first logical data page only occurs if the second logical data page is to be written to the first physical data page subsequent to writing the first logical data page to the first physical data page.

15. The method of claim 12, wherein reading the first logical data page occurs in response to an external request to receive a companion page of the second logical data page.

16. The method of claim 15, wherein the external request to receive the companion page of the second logical data page is received from an external processor having a device driver to determine a logical address of the companion page of the second logical data page, and wherein the external request to receive the companion page of the second logical data page comprises an external request to receive data corresponding to the logical address of the companion page.

17. The method of claim 12, wherein storing the first logical data page further comprises storing the first logical data page in an additional location selected from the group consisting of an additional location of the memory device and a location of an external device.

18. The method of claim 12, further comprising:
mapping the logical address of the first logical data page to correspond to the one or more other physical data pages of the memory device after writing the first logical data page to the one or more other physical data pages of the memory device.

19. A NAND flash memory device, comprising:
a memory array comprising multilevel memory cells arranged in rows and columns;
a storage register coupled to the memory array; and
control logic for control and/or access of the array of non-volatile memory cells;
wherein the storage register is configured to store a first data value from a first memory cell;
wherein the control logic is configured to send the first data value from the storage register to a second memory cell in the event of a failure to add a second data value to the first memory cell; and
wherein the storage register is inaccessible from an input/output port of the memory device.

20. The NAND flash memory device of claim 19, wherein the storage register is selected from the group consisting of a non-volatile storage register, a volatile storage register, and a static random access memory device.

* * * * *